United States Patent
Doglio et al.

(10) Patent No.: US 11,510,343 B2
(45) Date of Patent: Nov. 22, 2022

(54) INFORMATION HANDLING SYSTEM WITH A VIBRATION DAMPING AND AIR FLOW RECIRCULATION SEAL

(71) Applicant: DELL PRODUCTS, LP, Round Rock, TX (US)

(72) Inventors: Jean Doglio, Round Rock, TX (US); Eduardo Escamilla, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 181 days.

(21) Appl. No.: 16/919,738

(22) Filed: Jul. 2, 2020

(65) Prior Publication Data

US 2022/0003246 A1    Jan. 6, 2022

(51) Int. Cl.
*H05K 7/20*    (2006.01)
*F04D 29/66*   (2006.01)
*F04D 29/08*   (2006.01)

(52) U.S. Cl.
CPC ....... *H05K 7/20736* (2013.01); *F04D 29/083* (2013.01); *F04D 29/668* (2013.01)

(58) Field of Classification Search
None
See application file for complete search history.

(56) References Cited

U.S. PATENT DOCUMENTS

| | | | |
|---|---|---|---|
| 4,385,025 A * | 5/1983 | Salerno | F16F 1/3732 264/262 |
| 4,568,243 A * | 2/1986 | Schubert | F24F 7/013 415/213.1 |
| 10,595,437 B2 | 3/2020 | Carey et al. | |
| 2011/0188201 A1* | 8/2011 | Lin | H05K 7/20 361/688 |
| 2019/0327859 A1* | 10/2019 | Iyengar | G06F 1/20 |

* cited by examiner

*Primary Examiner* — Mukundbhai G Patel
(74) *Attorney, Agent, or Firm* — Larson Newman, LLP (57) ABSTRACT

An information handling system includes a vibration source, a vibration sink, and a damping seal. The damping seal includes a top surface and a bottom surface. The top surface may be placed in physical communication with the vibration source. The bottom surface may be placed in physical communication with the vibration sink. The damping seal may be compressed in between the vibration source and the vibration sink. The compression of the damping seal in between the vibration source and the vibration sink may provide an airflow seal within the information handling system. The damping seal may be molded from a semi-rigid material to provide vibration damping from the vibration source to a vibration sensitive component of the information handling system.

17 Claims, 4 Drawing Sheets

INFORMATION HANDLING SYSTEM WITH A VIBRATION DAMPING AND AIR FLOW RECIRCULATION SEAL

FIELD OF THE DISCLOSURE

The present disclosure generally relates to information handling systems, and more particularly relates to an information handling system with a vibration damping and air flow recirculation seal.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a vibration source, a vibration sink, and a damping seal. The damping seal includes a top surface and a bottom surface. The top surface is placed in physical communication with the vibration source. The bottom surface is placed in physical communication with the vibration sink. The damping seal is compressed in between the vibration source and the vibration sink. The compression of the damping seal in between the vibration source and the vibration sink provides an airflow seal within the information handling system. The damping seal is molded from a semi-rigid material to provide vibration damping from the vibration source to a vibration sensitive component of the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
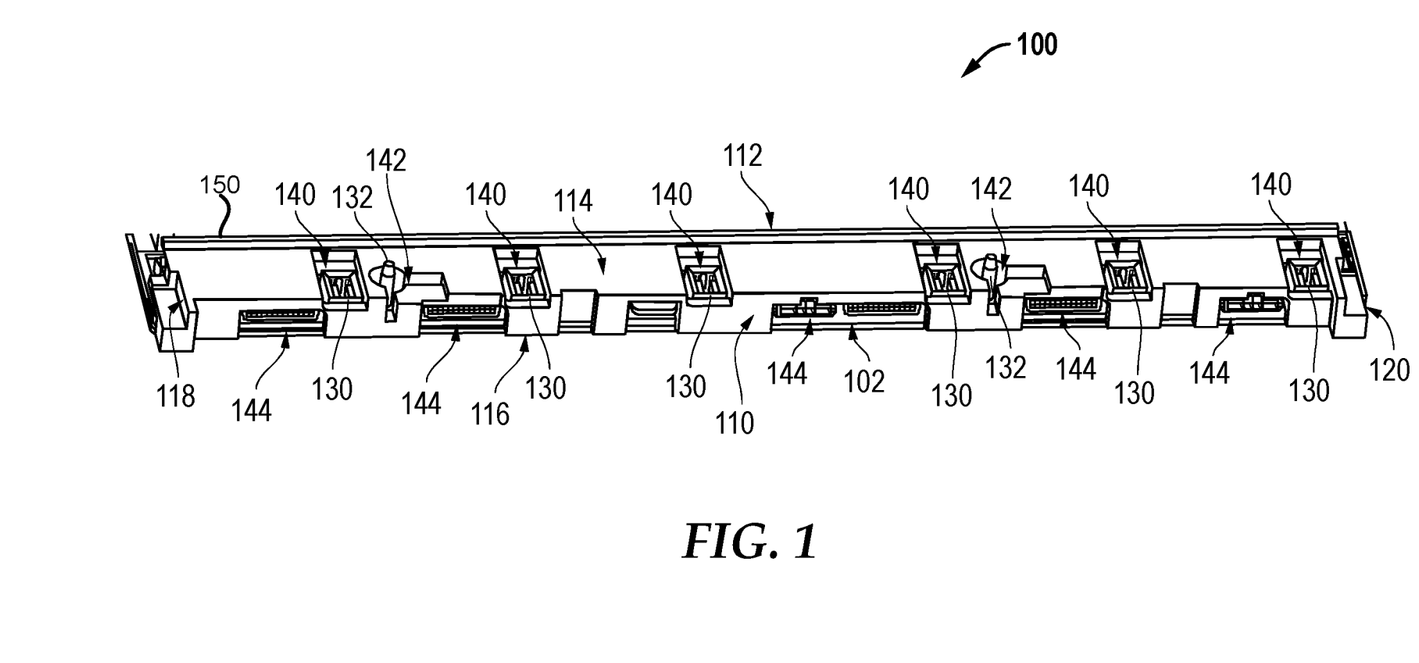
FIG. 1 is a top view of a damping seal for a fan gantry in an information handling system according to at least one embodiment of the disclosure.

FIG. 1 shows a damping seal 100 in physical communication with a portion motherboard 102 of an information handling system according to at least one embodiment of the disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

Damping seal 100 includes a front surface 110, a rear surface 112, a top surface 114, a bottom surface 116, and side surfaces 118 and 120. Motherboard 102 may include one or more fan connectors 130, and one or more alignment pins 132. In an example, fan connectors 140 may provide one or more communication channels between motherboard 102 and cooling fans of an information handling system. Additionally, alignments pins 132 may enable a fan gantry of the information handling system to mate with connectors 130.

In an example, damping seal 100 may be formed as a single continuous component in any suitable manner. For example, damping seal 100 may be molded from any suitable material. The material of damping seal 100 may be any semi-rigid material including, but not limited to, an elastomeric material, such as a visco-elastic material. In an example, damping seal 100 may be molded to fit onto and around motherboard 102. For example, damping seal 100 may be shaped during the molded process to form a tight physical communication between components of motherboard 102 and the motherboard itself.

In an example, damping seal 100 may be molded with one or more openings/holes within different surfaces of the damping seal. For example, damping seal 100 may include openings/holes 140 along top surface 114. Openings 140 may be any suitable shape including, but not limited to, a cylinder, square, and rectangle. In an example, each of openings 140 may be a different shape and/or size, or each of the openings may be the same size and shape. In certain examples, if openings 140 are either square or rectangle in shape, the openings may include first, second, third, and fourth surfaces that extend from bottom surface 116 through damping seal 100 to top surface 114. Each opening 140 may enable a different fan connector 140 of motherboard 102 to connect with a fan gantry an information handling system, such as fan gantry 204 of FIG. 2. Damping seal 100 may also be molded with one or more additional openings/holes 142 along top surface 114. Openings 142 may be any suitable shape including, but not limited to, a cylinder, square, and rectangle. In an example, each of openings 140 may be a different shape and/or size, or each of the openings may be the same size and shape. In certain examples, if openings 142 are cylinders, the cylindrical shape of the openings may extend from bottom surface 116 through damping seal 100 to top surface 114. Damping seal 100 may further be molded with one or more openings/holes 144 along top surface 114. Openings 144 may be any suitable shape including, but not limited to, a cylinder, square, and rectangle. In an example, each of openings 144 may be a different shape and/or size, or each of the openings may be the same size and shape. Each opening 144 may enable a different component of motherboard 102 to be accessed through damping seal 100.

In certain examples, damping seal 100 may include one or more features to improve airflow within an information handling system. One such feature may include the surface area of top surface 114 and the surface area of bottom surface 116 may be shaped and molded in any suitable manner. For example, the surface areas of top surface 114 and bottom surface 116 may be maximized within the available space to improve sealing performance of damping seal 100 within an information handling system. In an example, top surface 114 may provide continuous and uninterrupted physical contact with a fan gantry of an information handling system. Similarly, bottom surface 116 may provide continuous and uninterrupted physical contact with motherboard 102 of an information handling system. In an example, damping seal 100 includes an airflow barrier 150 to further improve airflow sealing by damping seal 100. Airflow barrier 150 may extend upward from an edge of top surface 114 along the intersection between the top surface and back surface 112 from side, and the airflow barrier may be from side surface 118 to side surface 120. In an example, airflow barrier 150 may prevent openings 140 from breaking the seal of damping seal 100.

In an example, damping seal 100 may be placed in physical communication with motherboard 102 without any changes needed in a server chassis of the information handling system. Further, both volume of damping seal 100 and contacting surface of the damping seal with motherboard 102 may be maximized within the available space of the server chassis to provide a maximum damping effect without utilizing additional space with the server chassis, as will be discussed in greater detail with respect to FIG. 2.

Figure 2:
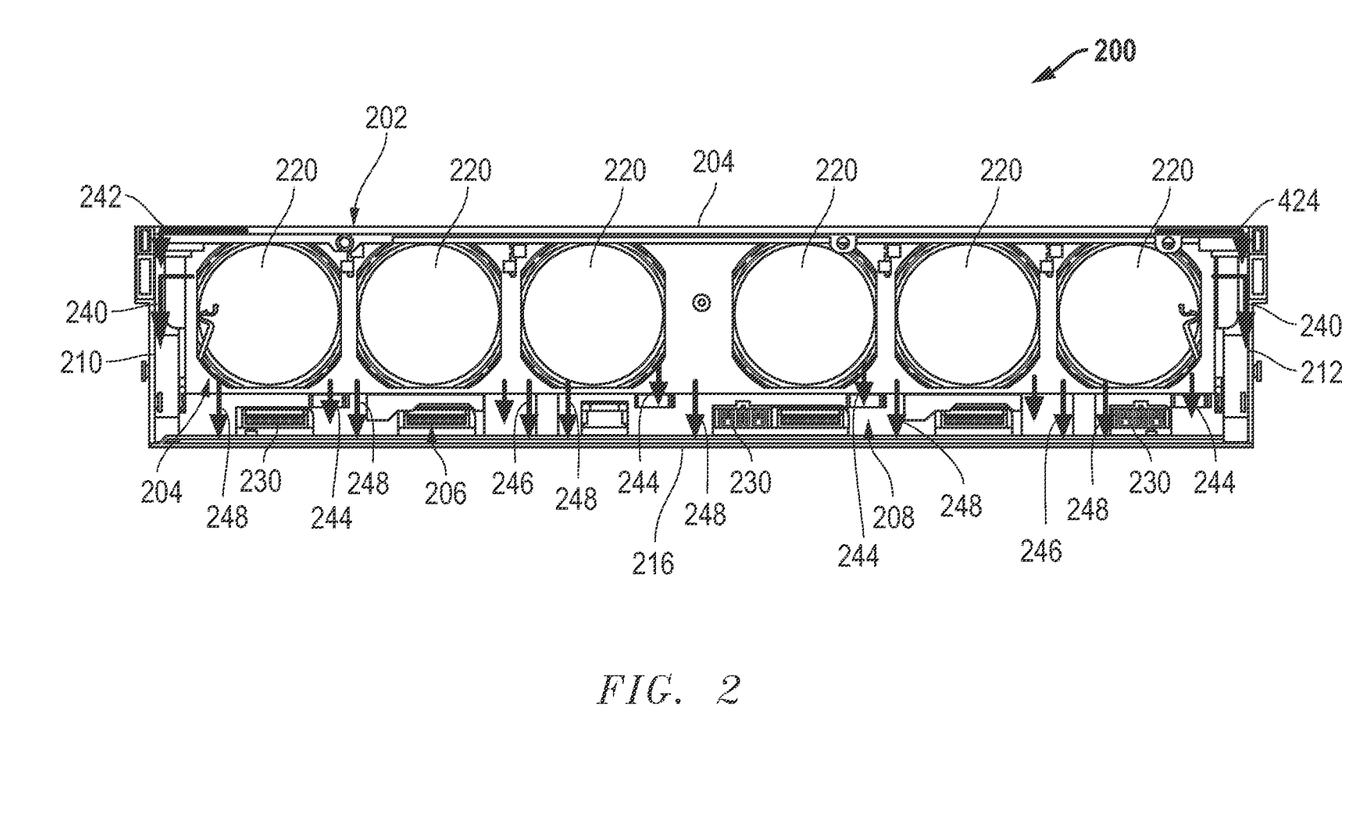
FIG. 2 is a front view of the damping seal in physical communication with a fan gantry, a server chassis, and a motherboard of an information handling system according to at least one embodiment of the present disclosure.

FIG. 2 illustrates a portion of an information handling system 200 according to at least one embodiment of the present disclosure. Information handling system 200 includes a server chassis structure 202, a fan gantry 204, a motherboard 206, and a damping seal 208. Server chassis 202 includes sides 210 and 212, a top/lid 214, and a bottom 216. Fan gantry 204 may include one or more fans 220. Motherboard 206 may include one or more components 230 to interface and communicate with one or more other devices within information handling system 200, such as hard disk drives. In an example, damping seal 208 may be placed in physical communication with server chassis structure 202, fan gantry 204, and motherboard 206.

In an example, damping seal 208 may be formed in any suitable way to increase stiffness, increase vibration damping, and provide an airflow seal of information handling system 200. For example, damping seal 208 may be molded from any suitable material. In an example, the material of damping seal 208 may be any semi-rigid material including, but not limited to, an elastomeric material, such as a visco-elastic material. In certain examples, the molded elastomeric material may enable damping seal 208 to be compressed between a vibration source, such as fan gantry 204, and a vibration sink, such as motherboard 206. In an example, damping seal 208 may reduce vibrations and/or shift frequencies of the vibrations transmitted from a vibration source, such as fan gantry 204, to a vibration sensitive component, such as hard disk drives, of information handling system 200. One of ordinary skill in the art would recognize that while damping seal 208 is described with respect to fan gantry 204 and motherboard 206, the damping seal may be compressed between any suitable vibration source and vibration sink to damping vibration and provide an airflow seal without vary from the scope of this disclosure.

Damping seal 208 may provide one or more improvements to the overall structure of information handling system 200. For example, damping seal 208 may increase the stiffness of server chassis 202 within information handling system 200, as compared to the stiffness of the server chassis without the damping seal. The increase in stiffness resulting from damping seal 208 being located within server chassis 202 may shift the frequencies of vibrations from fans 220 within fan gantry 204 to higher frequencies than originally produced by the fan gantry. In an example, the shifting of the frequencies of the vibrations may result in the vibrations being in less impactful ranges of frequencies, such that the vibration sensitive components of information handling system 200 are affected less by the vibrations from fan gantry 204.

Additionally, the molding of damping seal 208 may prevent any gaps from forming between the damping seal and sides 210 and 212 of server chassis 202, between the damping seal and fan gantry 204, between the damping seal and components of motherboard 206, and between the damping seal and motherboard 206. In an example, server chassis 202, fan gantry 204, motherboard 206, and damping seal 208 may be held together tighter as compared to a component that is not molded to fit among the components of information handling system 200.

In an example, damping seal 208 may provide one or more improvements to vibration damping within server chassis 202 of information handling system 200. Damping may include any reduction of vibration energy from fans 220 including, but not limited to, conversion of the vibration energy to heat, and transfer of the vibration energy away from a vibration sensitive component and to another component within information handling system 200. In an example, the visco-elastic material of damping seal 208 may dampen a particular amount of vibrations from fans 220. Additionally, damping seal 208 may dampen vibrations transmitted to vibration sensitive components by transferring or forcing more vibration energy through motherboard 206, which may act as any suitable vibration sink including, but not limited to, a mass or spring vibration sink. The molding of damping seal 208 may connect a larger portion of the mass of server chassis 202 to the vibration source, such as fans 220 of fan gantry 204. In an example, the larger amount of mass connected to fan gantry 204 may add additional vibration energy impedance to server chassis 202.

Damping seal 208 may improve information handling system 200 in one or more suitable manners by creating an airflow seal within server chassis 202. For example, damping seal 208 may be molded to exact precision to prevent any airflow gaps among server chassis 202, fan gantry 204, and motherboard 206. In an example, the prevention of airflow gaps may create a better airflow seal, which in turn may reduce a required rotations per minute (RPM) of fans 220 within fan gantry 204. The reduction of RPMs by fans 220 may result in less vibration energy and acoustical energy created and transmitted by the fans of fan gantry 204.

During operation of information handling system 200 and in particular fans 220, fan gantry 204 may transmit vibrations through different portions of server chassis 202. For example, a transmission path of vibration through information handling system 200 may be from fan gantry 204 to side walls 210 and 212 of server chassis 202 and then to bottom 216 of the server chassis, as illustrated by arrows 240 in FIG. 2. In an example, the transmission path shown by arrows 240 may represent a primary transmission path because a large amount of vibration energy is transferred from fan gantry 204 to server chassis 202 in this direction. In certain examples, each of arrows 240 may illustrate a separate vibration transmission path via the sides 210 and 214. In an example, the separate arrows 240 may for illustration only, such that the two illustrated transmission paths are only a single path. Additionally, the transmission paths along arrows 240 may provide the vibration to bottom 216 of server chassis 202 without any damping of the vibrations.

Server chassis 202 may include any other number of vibration transmission paths from fan gantry 204 to bottom 216 of the server chassis. For example, other vibration transmission paths, as indicated by arrows 242, may travel from fan gantry 204 to top 214 of server chassis 202, then to side walls 210 and 212, and down to bottom 216. In an example, the vibration transmission path, shown by arrows 242, may be considered a secondary path based on a lower amount of vibration energy traveling only this path as compared to the transmission paths of arrows 240. In certain examples, while multiple arrows 242 are illustrated from the vibration transmission via the top 214 and sides 210 and 212, the arrows 242 are for illustration only and the transmission path is only a single path. Additionally, the transmission paths along arrows 242 may provide the vibration to bottom 216 of server chassis 202 without any damping of the vibrations.

Another vibration path from fan gantry 204 to bottom 216 of server chassis may include connections between the fan gantry and motherboard 206. For example, motherboard 206 may include one or more fan connectors, such as fan connectors 130 of FIG. 1, to provide communication from the motherboard to fans 220, and the fan connectors may enable vibrations from the fan to transmit from the fans to the motherboard, as illustrated by arrows 244. In an example, the vibration transmission paths, shown by arrows 244, may be considered a secondary path based on a lower amount of vibration energy traveling along these paths as compared to the transmission paths of arrows 240. These secondary paths may be intermittent, such that the vibrations are not continuously provided along the transmission path illustrated by arrows 244. In certain examples, each of arrows 244 may illustrate a separate vibration transmission path via the fan connections. Additionally, the transmission path along arrows 244 may provide the vibration from fan gantry 204 to motherboard 206, and then to bottom 216 of server chassis 202. In an example, motherboard 206 may provide limited mass/spring damping of the vibrations based on the mass of the motherboard.

Additionally, alignment pins, such as alignment pins 132 of FIG. 1, mounted on motherboard 206 may be placed in physical communication with fan gantry 204, and the alignment pins may enable vibrations from the fan to transmit from the fans to the server chassis via the motherboard, as illustrated by arrows 246. Additional alignment pins may be mounted on server chassis 202, which may provide vibration transmission paths. In an example, the vibration transmission paths, shown by arrows 246, may be considered a secondary path based on a lower amount of vibration energy traveling along these paths as compared to the transmission paths of arrows 240. In another example, the secondary transmission paths shown by arrows 246 may be a more narrow area for the vibrations to travel as compared to the transmission paths of arrows 240. These secondary paths may be intermittent, such that the vibrations are not continuously provided along the transmission path illustrated by arrows 246. In certain examples, each of arrows 246 may illustrate a separate vibration transmission path via the alignment pins. Additionally, the transmission path along arrows 246 may provide the vibration to bottom 216 of server chassis 202 without any damping of the vibrations.

In previous information handling systems, the transmission paths shown by arrows 240, 242, 244, and 246 were the only paths by which vibrations travel from fan gantry 204 to bottom 216 of server chassis 202. While these paths directed vibrations, most of these paths did not provide damping of the vibration energy. In particular, the primary transmission path represented by arrows 240 does not provide damping of the vibration energy. Additionally, previous information handlings systems included components, such as acoustical foam, to reduce an amount of acoustical energy in the information handling system. However, these acoustical energy reduction components may introduce an airflow penalty within the server chassis.

Damping seal 208 may improve information handling system 200 by providing a new primary vibration transmission path, as shown by arrows 248. In an example, transmission path 248 may also provide damping of the vibration energy to prevent the vibrations from fan gantry 204 from affecting the vibration sensitive components within the information handling system. Transmission path 248 may provide vibrations from fan gantry 204 to damping seal 208, to motherboard 206, to a planar pan of server chassis 202, and to bottom 216. In an example, transmission path 248 may be a new primary path, which provides multiple forms of damping of the vibrations. For example, vibration energy along transmission path 248 may be dampened through losses within the visco-elastic material of damping seal 208. Additionally, the physical communication between damping seal 208 and motherboard 206 may provide further damping of the vibration energy along transmission path 248 via motion of the motherboard. In certain examples, while multiple arrows 248 are illustrated from the vibration transmission via damping seal 208, the arrows 248 are for illustration only and the transmission path is only a single path throughout the entire damping seal.

In an example, damping seal 208 may create vibration transmission path 248 from fans 220 to the vibration sensitive components of motherboard 206. However, the semi-rigid structure of damping seal 208 may provide damping of the vibration energy to a level that the vibration sensitive components are not affected by the vibrations. Additionally, precise fitting of the elastomeric material of damping seal 208 on motherboard 206 may reduce other vibrations generated within server chassis 202 of information handling system 200.

Damping seal 208 may further provide an airflow seal within server chassis 202 to improve airflow of information handling system 200. For example, as damping seal 208 does not utilize additional space within server chassis 102 beyond the previous existing space formed by fan gantry 204, motherboard 206, and sides 210 and 212, the damping seal does not block desired airflow paths. Instead, damping seal 208 may direct airflow to proper areas within server chassis 202 of information handling system 200.

Figure 3:
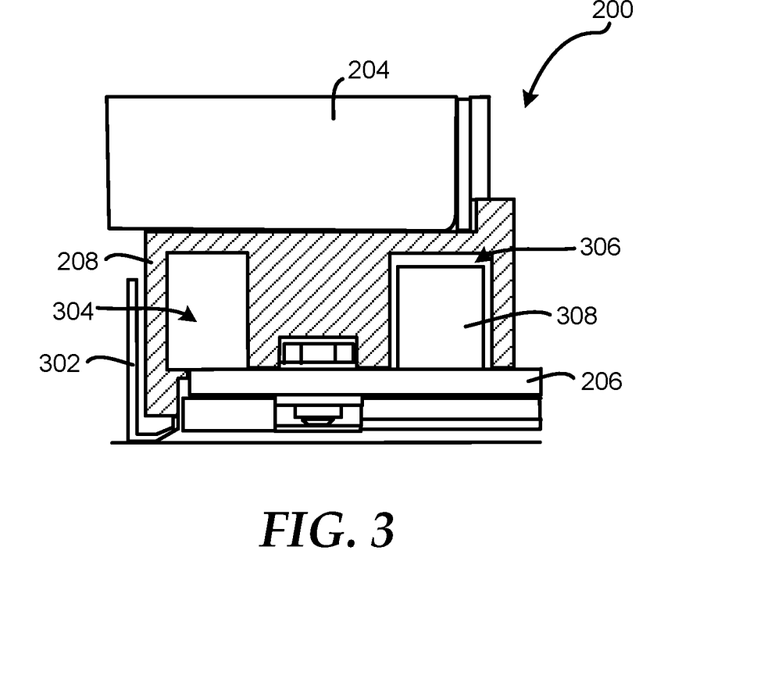
FIG. 3 is a side view of the damping seal located between the fan gantry and the motherboard according to at least one embodiment of the present disclosure.
Figure 4:
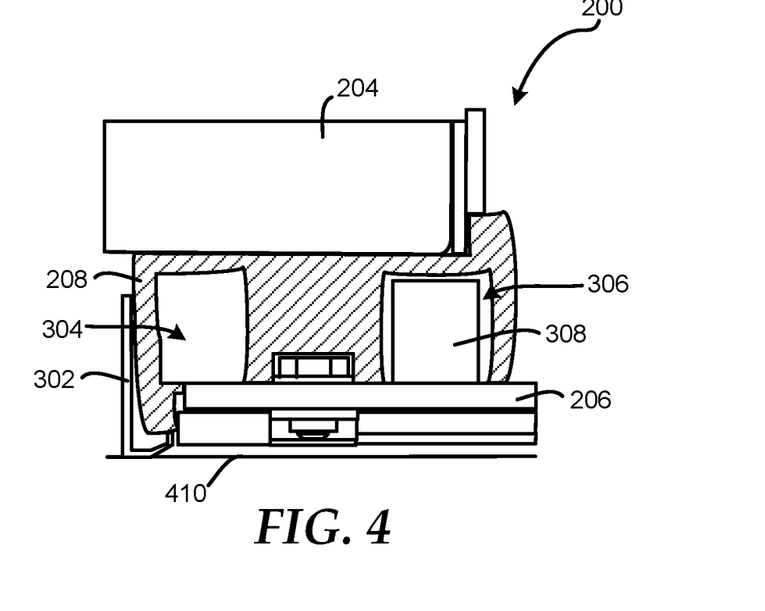
FIG. 4 is a side view of the damping seal under compression forces in between the fan gantry and the motherboard according to at least one embodiment of the present disclosure.

FIGS. 3 and 4 illustrate a side view of a portion of an information handling system 200 according to at least one embodiment of the present disclosure. Information handling system 200 includes a planar pan 302, fan gantry 204, motherboard 206, and damping seal 208. In an example, information handling system 200 may be any suitable information handling system including, but not limited to, information handling system 200 of FIG. 2. Similarly, fan gantry 204, motherboard 206, damping seal 208, and planar pan 302 may be components in any suitable information handling system including, but not limited to, the components of FIG. 2. In an example, damping seal 208 is located between and in physical communication with both fan gantry 204 and motherboard 206. Damping seal 208 is in physical communication with planar pan 302.

As shown in FIG. 3, damping seal 208 may include one or more cut-outs, such as relief cut-out 304 and component cut-out 306. In an example, relief cut-out 304 may be utilized in damping seal 208 to adjust a preload of the damping seal, or to provide uniform wall thickness for molding. Component cut-out 306 is made within damping seal 208 to avoid the damping seal from interfering with components, such as component 308, of motherboard 206.

A compliance member of fan gantry 204 may provide a compression on damping seal 208, which may be designed as an interference fit between the fan gantry and motherboard 206. In an example, the interface between fan gantry 204 and damping seal 208 should be enough for the compliance member to provide a compression force over an entire tolerance range of the damping seal.

As shown in FIG. 4, the force from the compliance member of the fan gantry 204 may compress damping seal 208, such that the walls or surface of the damping seal buckle or move from a first position, as shown in FIG. 3, to the compressed shape of FIG. 4. In an example, relief cut-out 304 and component cut-out 306 allow or enable damping seal 208 to compression uniformly. Additionally, the size of component cut-out 306 may be large enough that the surface of damping seal 208 does not touch component 308 while the damping seal is in the compressed shape. In an example, damping seal 208 is flexible enough to allow fan with fan gantry 204 to properly sit and interface with the damping seal, but also stiff enough to transfer a portion of the load from the fan gantry to planar pan 302. As stated above, damping seal 208 can transfer the load and vibration energy from fan gantry 204 to motherboard 206. While in the compressed shape, damping seal 208 may push planar pan 302 down into a bottom 410 of a server chassis, such as server chassis 202 of FIG. 2. When planar pan 208 is pushed into bottom 410, an assembly gap previously located between the planar pan and the bottom of the server chassis is closed. The compressed shape of damping seal 208 provides a damping vibration path from fan gantry 204 to motherboard 206 and then to bottom 410 of the server chassis of information handling system 200. Additionally, the seal formed by damping seal 208 in the compressed shape improves airflow within information handling system 200.

Figure 5:
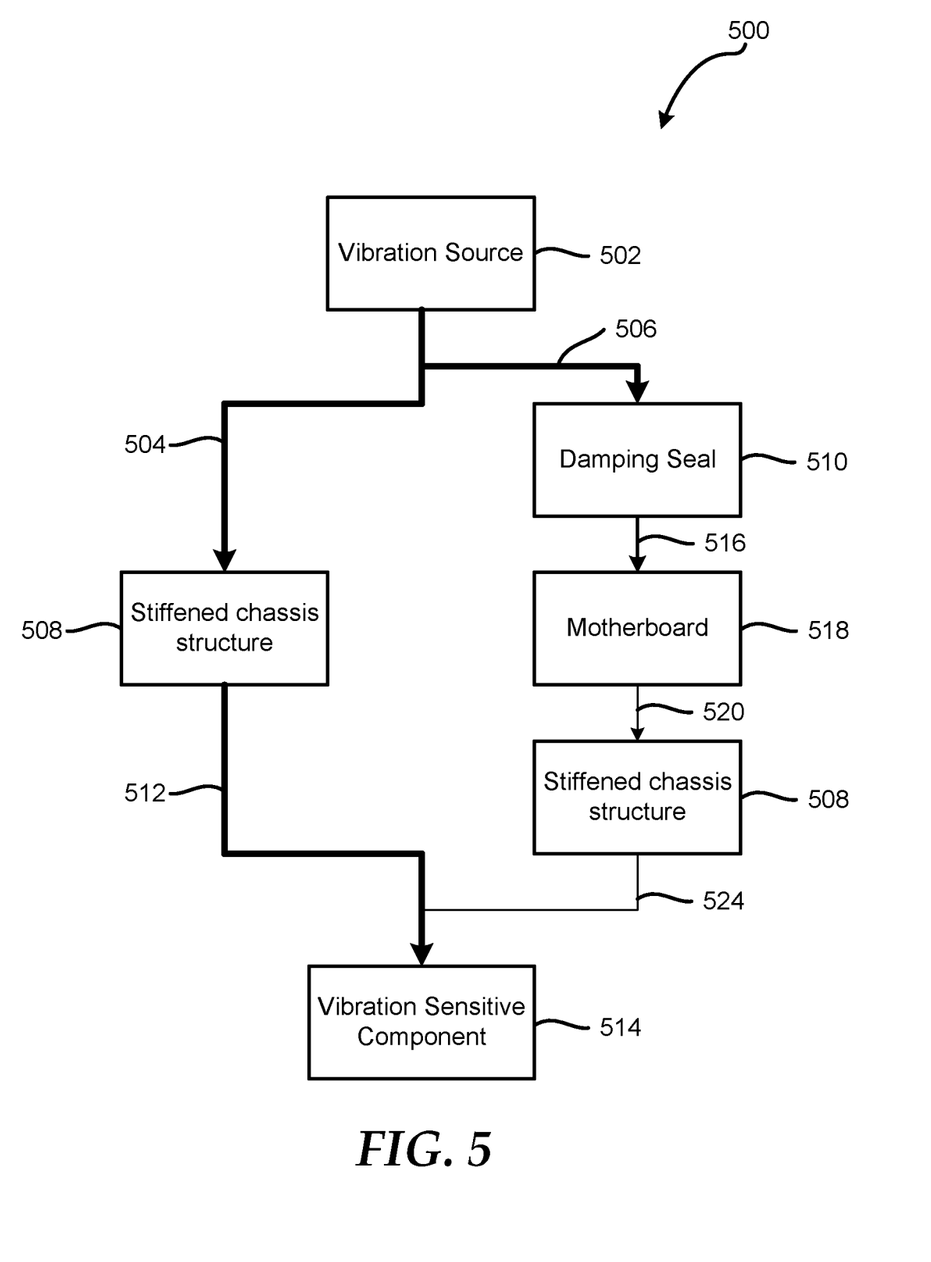
FIG. 5 is a flow diagram of vibration paths through of multiple vibration sinks located in between a vibration source and a vibration sensitive component according to at least one embodiment of the present disclosure.

FIG. 5 is a flow diagram 500 of vibration paths through multiple vibration sinks located in between a vibration source 502 and a vibration sensitive component 514 according to at least one embodiment of the present disclosure. In certain examples, the weight of the lines of the transmission path may represent vibration energy levels within the path. For example, the heavier the line, the more vibration energy within that particular transmission path. One of ordinary skill in the art would recognize that the weights are representative and are not drawn to scale. In an example, vibration source 502 may provide vibration energy through vibration paths 504 and 506. For example, the vibration source 502 may be a fan gantry of an information handling system, and vibration transmission path 504 may provide vibration energy from the vibration source to a stiffened chassis structure 508 of the information handling system.

In an example, the vibration source may be in physical communication with the chassis structure, such as a server chassis, to provide the vibration transmission path 504. Stiffened chassis structure 508 may be accomplished by physical communication with a semi-rigid material, such as damping seal 510. For example, damping seal 510 may rigidity to stiffened chassis structure 508 to stiffen the chassis structure as compared to a chassis structure not in physical communication with the damping seal.

Stiffened chassis structure 508 in physical communication with the damping seal 510 may shift vibration energy received from vibration source 502 from the current frequency to a higher frequency. In an example, the higher frequency may be less problematic for vibration sensitive component 514. For example, the higher frequency vibration energy traveling from stiffened chassis structure 508 along transmission path 512 to vibration sensitive component 514 may affect the vibration sensitive component to a lesser degree than if receiving the vibration energy provided along transmission path 504.

In an example, damping seal 510 may damp vibration energy received from transmission path 506. For example, visco-elastic material of damping seal 510 may produce vibration energy losses to reduce the vibration energy as the vibrations travel through the damping seal. In an example, damping seal 510 may be any suitable damping including, but not limited to, damping seal 100 of FIG. 2, damping seal 208 of FIG. 2, and damping seal 208 of FIGS. 3 and 4.

The vibrations may then travel from damping seal 510 along transmission path 516 to a motherboard 518. In an example, motherboard 518 may further dampen the vibration energy in any suitable manner. For example, motherboard 518 may be a mass-spring vibration sink based on the mass of the motherboard and its physical attachment to stiffen chassis structure 508. The vibration losses of the vibration sink within motherboard 518 may further reduce the vibration energy before the vibrations reach vibration sensitive component 514. After passing through motherboard 518, the vibration energy moves along transmission path 520 to stiffened chassis structure 508.

In an example, stiffened chassis structure 508 may shift vibration energy received from motherboard 518 to a higher frequency. In an example, the higher frequency may be less problematic for vibration sensitive component 514. For example, the higher frequency vibration energy traveling from stiffened chassis structure 508 along transmission path 524 to vibration sensitive component 514 may affect the vibration sensitive component to a lesser degree than if receiving the vibration energy provided along transmission path 520.

As stated above, the weight of the lines of the transmission path may represent vibration energy levels within the path. Thus, transmission paths 504, 506 and 512 have the largest amount of vibration energy. Vibration path 516 has the next highest level of vibration energy, followed by transmission paths 520 and 524. Thus, damping seal 510 may improve an information handling system by damping vibration energy in one or more suitable manners. For example, damping seal 510 may stiffen chassis structure 508 to shift the frequency of the vibration energy to lower an effect of the vibration energy on vibration sensitive component 514. Also, damping seal 510 may create a new transmission path for the vibrations, and the material of damping seal 510, such as an elastomeric material, may dampen the vibration energy through this new transmission path.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A damping seal for use within an information handling system, the damping seal comprising:
    a top surface to be placed in physical communication with a vibration source of the information handling system; and
    a bottom surface to be placed in physical communication with a vibration sink of the information handling system, wherein the damping seal is in physical communication with sides of a stiffened chassis structure, and the vibration sink is in physical communication with the stiffened chassis structure, wherein the damping seal is configured to be compressed in between the vibration source and the vibration sink,
    wherein the compression of the damping seal in between the vibration source and the vibration sink provides an airflow seal within the information handling system,
    wherein the damping seal is molded from a semi-rigid material to provide vibration damping from the vibration source to a vibration sensitive component of the information handling system, and
    wherein the damping seal is placed in physical communication with the stiffened chassis structure to shift vibrations from the vibration source to higher vibration frequencies as compared to vibration frequencies from the vibration source, wherein the higher vibration frequencies have less impactful ranges as compared to the vibration frequencies from the vibration source.

2. The damping seal of claim 1, further comprising:
    a plurality of openings extending from the bottom surface through the top surface, wherein the plurality of openings enable a plurality of connectors to connect the vibration sink to the vibration source.

3. The damping seal of claim 1, wherein the physical communication with both the vibration source and the vibration sink forces vibration through the vibration sink.

4. The damping seal of claim 1, wherein the damping seal is substantially the same length as the vibration source.

5. The damping seal of claim 4, wherein a size of the damping seal connects a larger portion of a chassis mass of the information handling system to the vibration source.

6. The damping seal of claim 1, wherein the semi-rigid material is a visco-elastic material.

7. An information handling system comprising:
a vibration source;
a vibration sink; and
a damping seal, the damping seal including:
a top surface to be placed in physical communication with the vibration source; and a bottom surface to be placed in physical communication with the vibration sink,
wherein the damping seal is in physical communication with sides of a stiffened chassis structure, and the vibration sink is in physical communication with the stiffened chassis structure, wherein the damping seal is configured to be compressed between the vibration source and the vibration sink,
wherein the compression of the damping seal provides an airflow seal within the information handling system,
wherein the damping seal is molded from a semi-rigid material to provide vibration damping from the vibration source to a vibration sensitive component of the information handling system, and
wherein the damping seal is placed in physical communication with a stiffened chassis structure to shift vibrations from the vibration source to higher vibration frequencies as compared to vibration frequencies from the vibration source, wherein the higher vibration frequencies have less impactful ranges as compared to the vibration frequencies from the vibration source.

8. The information handling system of claim 7, further comprising:
a plurality of openings extending from the bottom surface through the top surface, wherein the plurality of openings enable a plurality of connectors to connect the vibration sink to the vibration source.

9. The information handling system of claim 7, wherein the physical communication with both the vibration source and the vibration sink forces vibration through the vibration sink.

10. The information handling system of claim 7, wherein a size of the damping seal connects a larger portion of a chassis mass of the information handling system to the vibration source.

11. The information handling system of claim 7, wherein the semi-rigid material is a visco-elastic material.

12. The information handling system of claim 7, wherein the vibration sensitive component is a hard disk drive of the information handling system.

13. The information handling system of claim 7, wherein the vibration source is a fan gantry of the information handling system.

14. The information handling system of claim 7, wherein the vibration sink is a motherboard of the information handling system.

15. An information handling system comprising:
a chassis structure;
a vibration source in physical communication with the chassis structure, wherein a first amount of vibration is passed from the vibration source to the chassis structure;
a vibration sink; and
a damping seal including:
a top surface to be placed in physical communication with the vibration source; and
a bottom surface to be placed in physical communication with the vibration sink, wherein the damping seal is in physical communication with sides of the chassis structure, and the vibration sink is in physical communication with the stiffened chassis structure, wherein the damping seal is configured to be compressed in between the vibration source and the vibration sink,
wherein the compression of the damping seal provides an airflow seal within the information handling system,
wherein the damping seal is molded from a semi-rigid material to provide vibration damping from the vibration source to a vibration sensitive component of the information handling system, and
wherein the damping seal is placed in physical communication with the chassis structure to shift vibrations from the vibration source to higher vibration frequencies as compared to vibration frequencies from the vibration source, wherein the higher vibration frequencies have less impactful ranges as compared to the vibration frequencies from the vibration source.

16. The information handling system of claim 15, further comprising:
a plurality of openings extending from the bottom surface through the top surface, wherein the plurality of openings enable a plurality of connectors to connect the vibration sink to the vibration source.

17. The information handling system of claim 15, wherein the physical communication with both the vibration source and the vibration sink forces a second amount of vibration through the vibration sink.

* * * * *